United States Patent
Lin

(10) Patent No.: US 11,864,356 B2
(45) Date of Patent: Jan. 2, 2024

(54) ALUMINUM OR COPPER FOIL HEAT DISSIPATOR AND ELECTRONIC DEVICE HAVING THE SAME

(71) Applicant: ALPHA NETWORKS INC., Hsinchu (TW)

(72) Inventor: Tzu-Chih Lin, Hsinchu (TW)

(73) Assignee: ALPHA NETWORKS INC., Hsinchu (TW)

( * ) Notice: Subject to any disclaimer, the term of this patent is extended or adjusted under 35 U.S.C. 154(b) by 0 days.

(21) Appl. No.: 17/706,004

(22) Filed: Mar. 28, 2022

(65) Prior Publication Data

US 2023/0189481 A1 Jun. 15, 2023

(30) Foreign Application Priority Data

Dec. 3, 2021 (TW) .................................. 110145154

(51) Int. Cl.
*H05K 7/20* (2006.01)
(52) U.S. Cl.
CPC ................................ *H05K 7/20454* (2013.01)
(58) Field of Classification Search
CPC .................................................. H05K 7/20454
See application file for complete search history.

(56) References Cited

U.S. PATENT DOCUMENTS

| 8,477,499 B2 * | 7/2013 | Hill | H05K 7/2039 361/818 |
| 2022/0091484 A1 * | 3/2022 | Ali | H04N 23/52 |

FOREIGN PATENT DOCUMENTS

| CN | 203353019 U | 12/2013 |
| CN | 109040379 A | 12/2018 |
| JP | 2013-226713 A | 11/2013 |
| JP | 2019-4005 A | 1/2019 |
| TW | M474327 U | 3/2014 |

OTHER PUBLICATIONS

Taiwanese Search Report for Taiwanese Application No. 110145154, dated May 11, 2022, with English translation.

* cited by examiner

*Primary Examiner* — Mukundbhai G Patel
(74) *Attorney, Agent, or Firm* — Birch, Stewart, Kolasch & Birch, LLP

(57) ABSTRACT

An electronic device having an aluminum or copper foil heat dissipator includes a casing, an electronic structure disposed in the casing, and an aluminum or copper foil heat dissipator. A surface of the electronic structure has a heat source element. The aluminum or copper foil heat dissipator is a 3D aluminum or copper foil structure formed by stamping and includes a bottom, a surrounding portion, and a 3D space formed between the bottom and the surrounding portion. The bottom is thermal conductively coupled to the heat source element. A surface of the aluminum or copper foil heat dissipator is partially/entirely thermal conductively coupled to an inner surface of the casing. With the characteristics of aluminum or copper foil that is easy to expand into a 3D shape during processing and could closely fit the inner surface, the heat generated by the heat source element could be dissipated from the 3D aluminum or copper foil with a large contact area, achieving better heat dissipation effect.

8 Claims, 9 Drawing Sheets

ALUMINUM OR COPPER FOIL HEAT DISSIPATOR AND ELECTRONIC DEVICE HAVING THE SAME

BACKGROUND OF THE INVENTION

Technical Field

The present invention relates generally to structures of an electronic device, and more particularly to an aluminum or copper foil heat dissipator and an electronic device having the aluminum or copper foil heat dissipator.

Description of Related Art

Typically, a heat source of conventional electronic devices is concentrated in chips such as a central processing unit, a memory, and a signal processing unit, etc., wherein these chips have a working limit temperature. If the temperature of the chips exceeds the working limit temperature, the chips will break, or make an error while processing signals.

To solve the aforementioned problem, a heat sink is usually arranged on a chip to dissipate heat of a heat source of the chip to the air by heat convection, or to guide heat of the heat source of the chip to structures such as a copper column or a casing to dissipate heat by heat conduction. However, the heat sink of the heat conduction is a flat metal sheet, which can only conduct heat through a thermal pad, with a limited area in contact with the casing having a zigzag shape therein, so the low heat dissipation efficiency needs to be improved.

BRIEF SUMMARY OF THE INVENTION

In view of the above, the primary objective of the present invention is to provide an electronic device having a 3D aluminum or copper foil heat dissipator, which could provide a better heat dissipation efficiency through the 3D aluminum or copper foil heat dissipator formed by stamping.

The present invention provides an electronic device including a casing, an electronic structure disposed in the casing, and an aluminum or copper foil heat dissipator, wherein a surface of the electronic structure has at least one heat source element. The aluminum or copper foil heat dissipator is a 3D aluminum or copper foil structure formed by stamping and includes a bottom and a surrounding portion connected around a periphery of the bottom, wherein a 3D space is formed between the bottom and the surrounding portion. The bottom is thermal conductively coupled to the at least one heat source element. At least one part of a surface of the aluminum or copper foil heat dissipator is thermal conductively coupled to an inner surface of the casing.

The present invention further provides an aluminum or copper foil heat dissipator for an electronic device, wherein the aluminum or copper foil heat dissipator is a 3D aluminum or copper foil structure formed by stamping and includes a bottom and a surrounding portion connected around a periphery of the bottom. A 3D space is formed between the bottom and the surrounding portion. The bottom is thermal conductively coupled to a heat source element of the electronic device.

With the aforementioned design, since the aluminum or copper foil heat dissipator is an aluminum or copper foil formed by stamping, the aluminum or copper foil heat dissipator could be processed to fit a shape of the casing, increasing an area that the aluminum or copper foil heat dissipator connected with the casing or in contact with air, thereby providing better heat convection or heat conduction effect. In this way, a heat dissipation efficiency of the electronic device could be enhanced and a temperature of the electronic device could be lowered, so that the heat source element could work well in an environment with higher temperatures.

Additionally, the aluminum or copper foil heat dissipator is a 3D shape having the bottom and the surrounding portion, and the electronic structure could be received in the 3D space in the aluminum or copper foil heat dissipator, thereby an available space between the casing and the electronic structure could be effectively utilized, so that the configuration of the electronic structure and the aluminum or copper foil heat dissipator in the casing could not only be more compact, but also has excellent heat dissipation effect at the same time.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
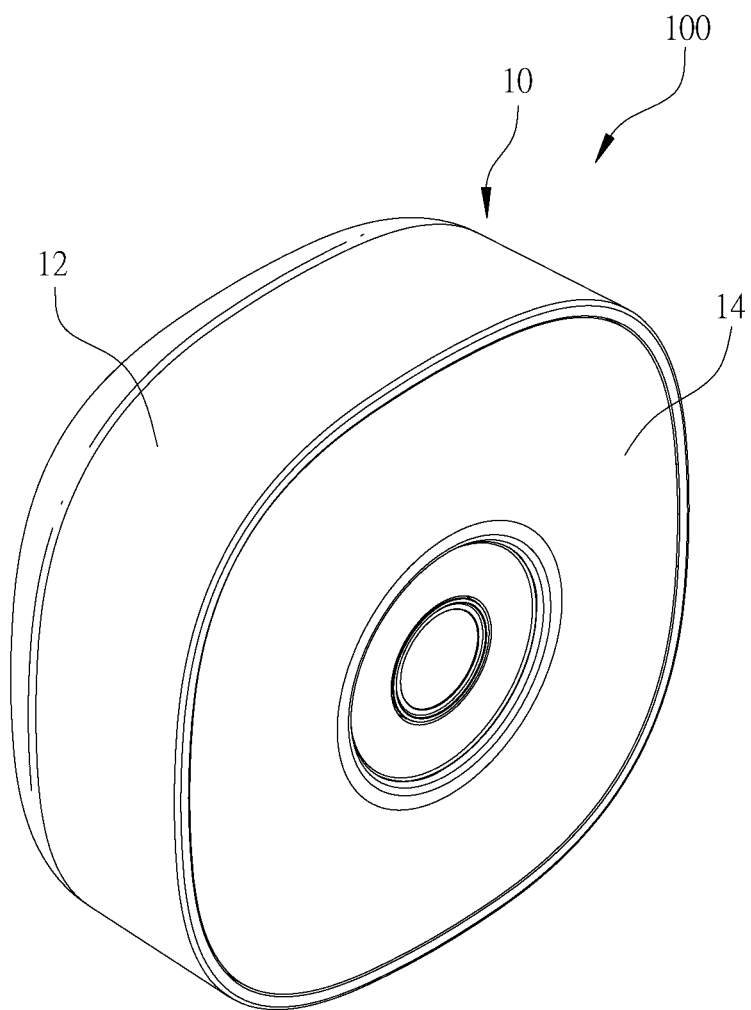
FIG. 1 is a perspective view of the electronic device according to a first embodiment of the present invention.
Figure 2:
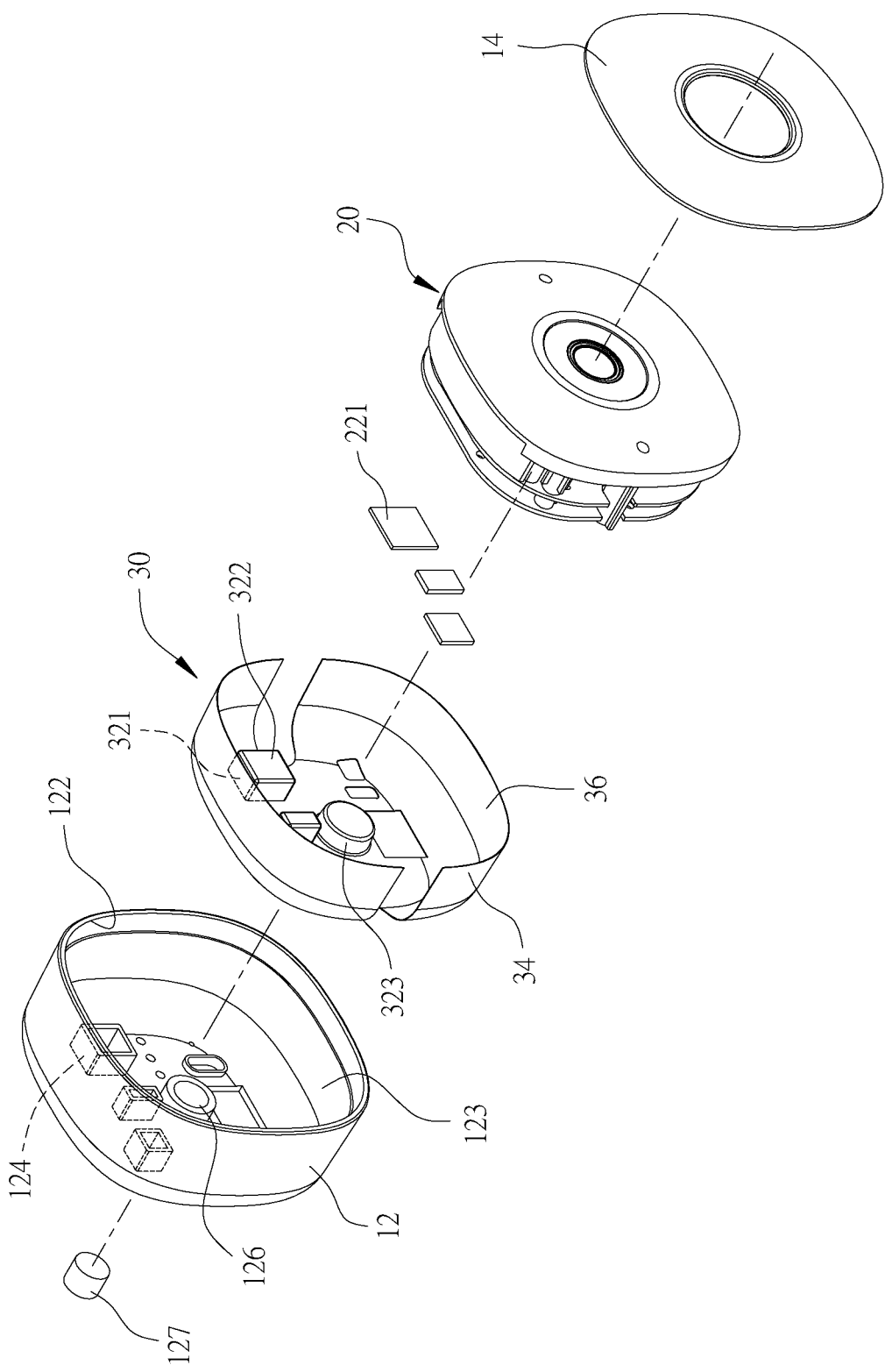
FIG. 2 is an exploded view of the electronic device according to the first embodiment of the present invention.
Figure 3:
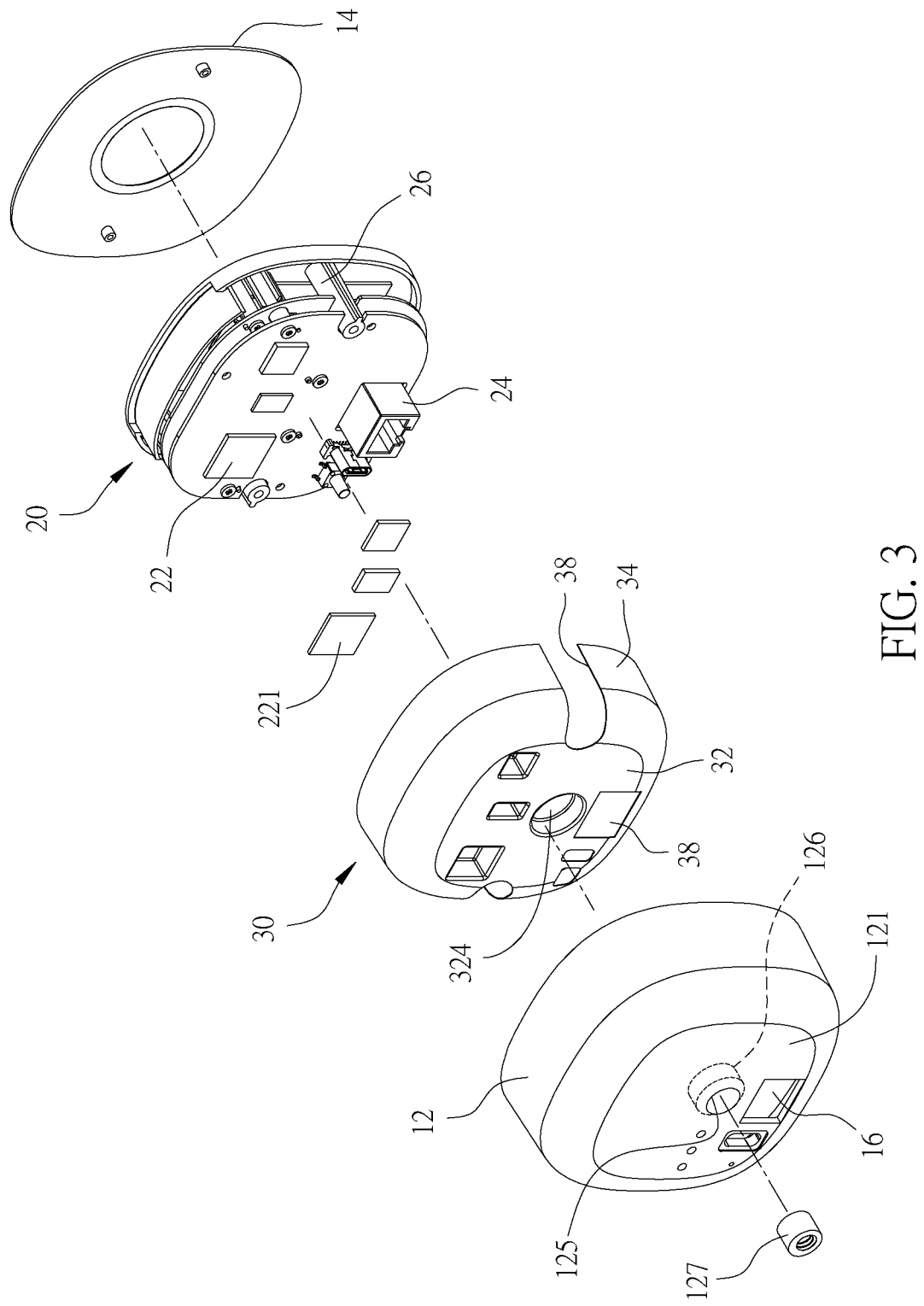
FIG. 3 is an exploded view of the electronic device according to the first embodiment of the present invention seen from another direction.
Figure 4:
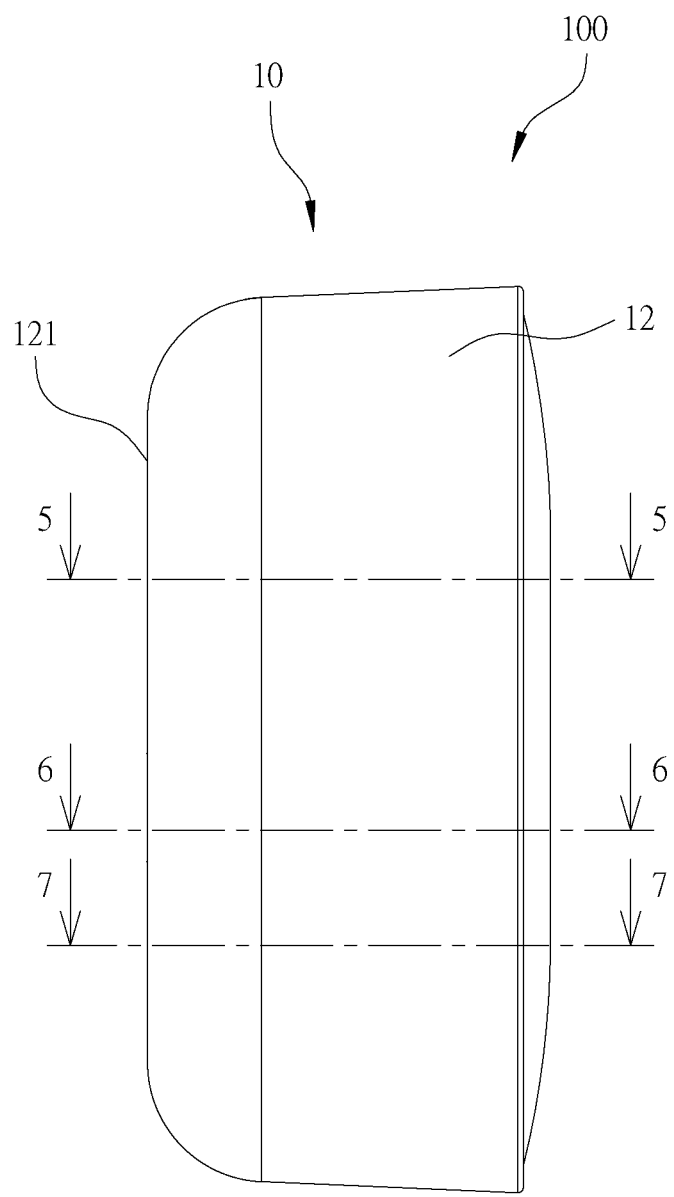
FIG. 4 is a side view of the electronic device according to the first embodiment of the present invention.
Figure 5:
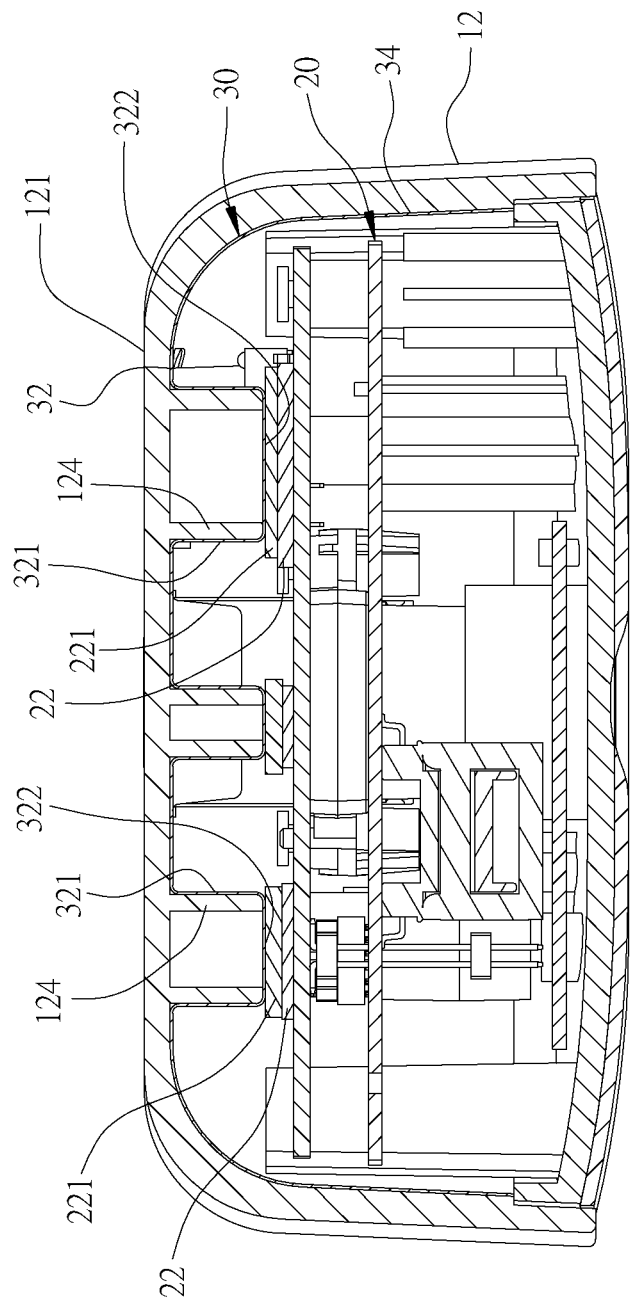
FIG. 5 is a sectional view along the 5-5 line in FIG. 4.
Figure 6:
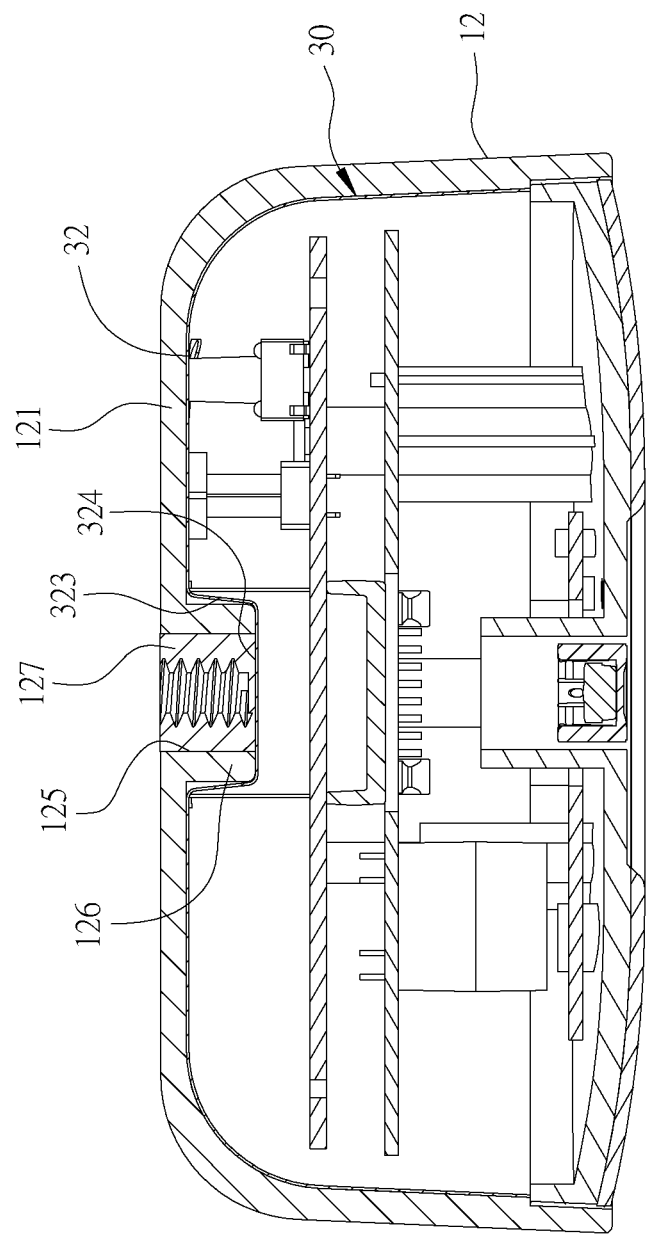
FIG. 6 is a sectional view along the 6-6 line in FIG. 4.
Figure 7:
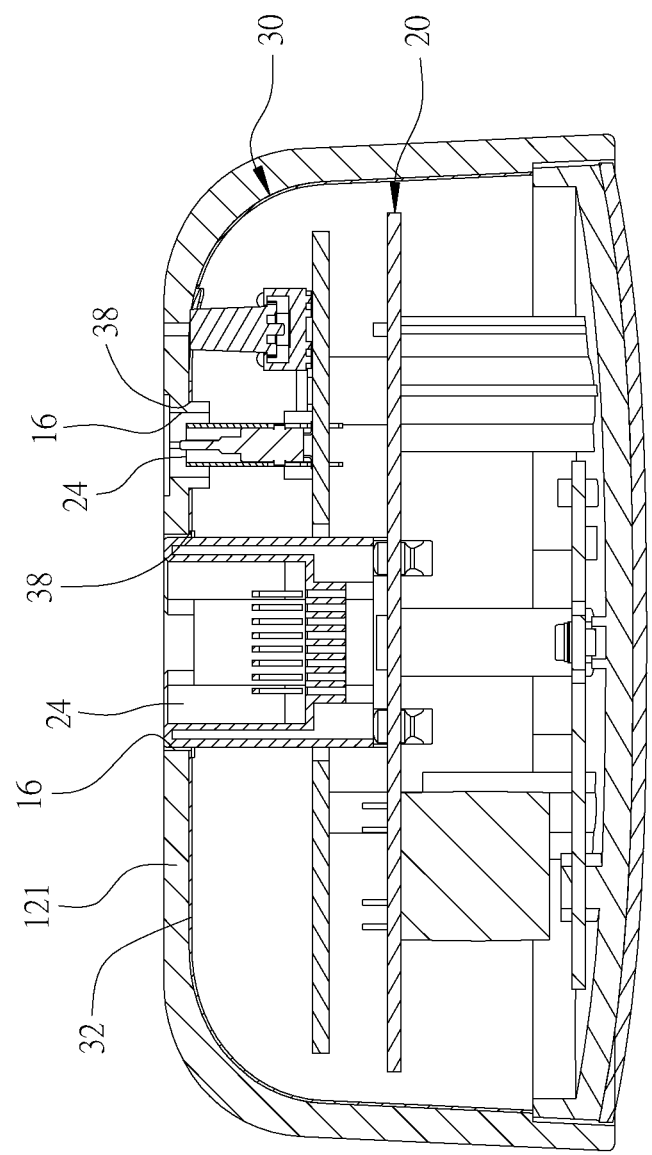
FIG. 7 is a sectional view along the 7-7 line in FIG. 4.

An electronic device 100 having an aluminum or copper foil heat dissipator 30 according to a first embodiment of the present invention is illustrated in FIG. 1 to FIG. 7, wherein the electronic device 100 includes a casing 10, an electronic structure 20, and the aluminum or copper foil heat dissipator 30.

The casing 10 could be a case made of metal, plastic, or composite materials such as aluminum-magnesium alloy, thereby meeting different requirements. In the current embodiment, the casing 10 is a plastic case and has a rear holder 12 and a front cover 14, wherein a rear side of the rear holder 12 away from the front cover 14 has a rear plate 121, while a front side of the rear holder 12 facing the front cover 14 has an opening 122. An inside of the rear holder 12 has a mounting space 123. The front cover 14 is engaged with the rear holder 12 at the opening 122 and close the mounting space 123.

The electronic structure 20 is disposed in the casing 10. A surface of the electronic structure 20 has at least one heat source element 22. In the current embodiment, the electronic structure 20 is disposed in the casing 10 and is connected to the front cover 14, and a rear surface of the electronic structure 20 facing the aluminum or copper foil heat dissipator 30 has three heat source elements 22 of three chips.

The aluminum or copper foil heat dissipator 30 is a 3D aluminum or copper foil structure formed by stamping, wherein the aluminum or copper foil heat dissipator 30 includes a bottom 32 and a surrounding portion 34 connected around a periphery of the bottom 32, thereby forming a 3D space 36 between the bottom 32 and the surrounding portion 34. In the current embodiment, a part of a rear side of the electronic structure 20 is received in the 3D space 36, and the bottom 32 is thermal conductively coupled to the heat source elements 22 (i.e., in a way that could conduct heat between the bottom 32 and the heat source elements 22). At least a part of a surface of the aluminum or copper foil heat dissipator 30 is coated with a heat conductive glue to be thermal conductively coupled to an inner surface of the casing 10. In the current embodiment, the surface of the aluminum or copper foil heat dissipator 30 is entirely coated with the heat conductive glue to be thermal conductively coupled to the inner surface of the casing 10.

With the aluminum or copper foil heat dissipator 30 formed by stamping, the shape of the aluminum or copper foil heat dissipator 30 could fit the shape of the inner surface of the casing 10, allowing partial or even the entire surface of the aluminum or copper foil heat dissipator 30 be thermal conductively coupled to the inner surface of the casing 10, thereby providing a better heat dissipation efficiency. Additionally, the 3D structure of the aluminum or copper foil heat dissipator 30 could cover a larger area than a flat heat dissipator, increasing a heat dissipation area for air convection or heat conduction, improving a heat dissipation efficiency of the aluminum or copper foil heat dissipator 30, and effectively reducing a temperature of the heat source elements 22.

Moreover, the aluminum or copper foil heat dissipator 30 is a 3D structure having the bottom 32 and the surrounding portion 34, which could make good use of the mounting space 123 inside the casing 10 compared to a flat heat sink. When a part of the electronic structure 20 is received in the 3D space 36, characteristics of light, thin, easy to change shape, and good thermal conductivity could be more prominent. The aluminum or copper foil heat dissipator 30 could effectively utilize an available space between the casing 10 and the electronic structure 20 by disposing the 3D aluminum or copper foil heat dissipator 30 in the casing without increasing the volume of the casing 10.

In other embodiments, the aluminum or copper foil heat dissipator 30 could be reversely installed, at this time, the aluminum or copper foil heat dissipator 30 is thermal conductively coupled to the heat source elements 22 via the bottom 32, and the surrounding portion 34 is exposed to air to achieve convective cooling, or a surface of the surrounding portion 34 is thermal conductively coupled to an object (e.g. to be thermal conductively coupled to the inner surface of the casing 10) to achieve external heat conduction and heat dissipation.

Referring to FIG. 2 to FIG. 7, two supporting members 26 are respectively disposed on two lateral sides of the electronic structure 20, wherein each of the supporting members 26 is penetrated through by a bolt to be connected to the front cover 14. A plurality of member openings 16 is disposed on the rear plate 121 of the rear holder 12, and a plurality of electronic members 24 is disposed on the electronic structure 20 and extends toward the rear holder 12 to abut against the member openings 16. The aluminum or copper foil heat dissipator 30 is provided with a plurality of through holes in accordance with the positions and numbers of the supporting members 26 and the electronic members 24, wherein each of the through-holes 38 is adapted to be penetrated through by one of the supporting members 26 or one of the electronic members 24. The through-holes 38 are formed by stamping the aluminum or copper foil heat dissipator 30 and then cutting with a tool.

The heat source elements 22 of the electronic structure 20 and the rear plate 121 of the casing 10 are spaced apart by a distance, so that when the bottom 32 of the aluminum or copper foil heat dissipator 30 coated with the heat conductive glue is thermal conductively coupled to the inner surface of the casing 10, the bottom 32 could not in contact with the heat source elements 22 if a surface of the bottom 32 is flat, or the heat source elements 22 may have different thicknesses in other embodiments. To solve such problem, while stamping the aluminum or copper foil heat dissipator 30, the aluminum or copper foil heat dissipator 30 is stamped to form at least one protruding portion 321 at a position corresponding to the heat source elements 22, wherein the at least one protruding portion fits a distance between the bottom 32 of the aluminum or copper foil heat dissipator 30 and each of the heat source elements 22. In the current embodiment, the bottom 32 has three columnar protruding portions 321, wherein each of the protruding portions 321 extends toward one of the heat source elements 22 and forms a contact surface 322 at a front side of each of the protruding portions 321 facing the heat source elements 22. A thermal pad 221 is disposed on each of the contact surfaces 322 to be thermal conductively coupled to each of the heat source elements 22.

To provide the protruding portions 321 extra support and make the aluminum or copper foil heat dissipator 30 be attached to the inner face of the casing 10, at least one support protrusion 124, which is hollow, is formed on an inner surface of the rear plate 121 of the casing 10. In the current embodiment, the rear plate 121 has three support protrusions 124 respectively inserted into the protruding portions 321 to support the protruding portions 321; a surface of each of the protruding portions 321 is coated with a heat conductive glue to be thermal conductively coupled to one of the support protrusions 124. To further enhance a heat dissipation performance of the aluminum or copper foil heat dissipator 30, a column hole 125 is disposed on the rear holder 12 of the casing 10, and a peripheral edge of the column hole 125 is connected to a column tube 126 protruding toward the front cover 14, and a copper column 127 having a threaded hole is inserted and fixed in the column tube 126. The bottom 32 of the aluminum or copper foil heat dissipator 30 has a copper column cover 323 formed by stamping, wherein the copper column cover 323 fits around the column tube 126 and forms a contact surface 324 at a surface adjacent to the copper column 127. The contact surface 324 of the copper column cover 323 is coated with a heat conductive glue to be thermal conductively coupled to the copper column 127, thereby the aluminum or copper foil heat dissipator 30 could conduct the heat of the heat source elements 22 outward through the copper column 127.

Figure 8:
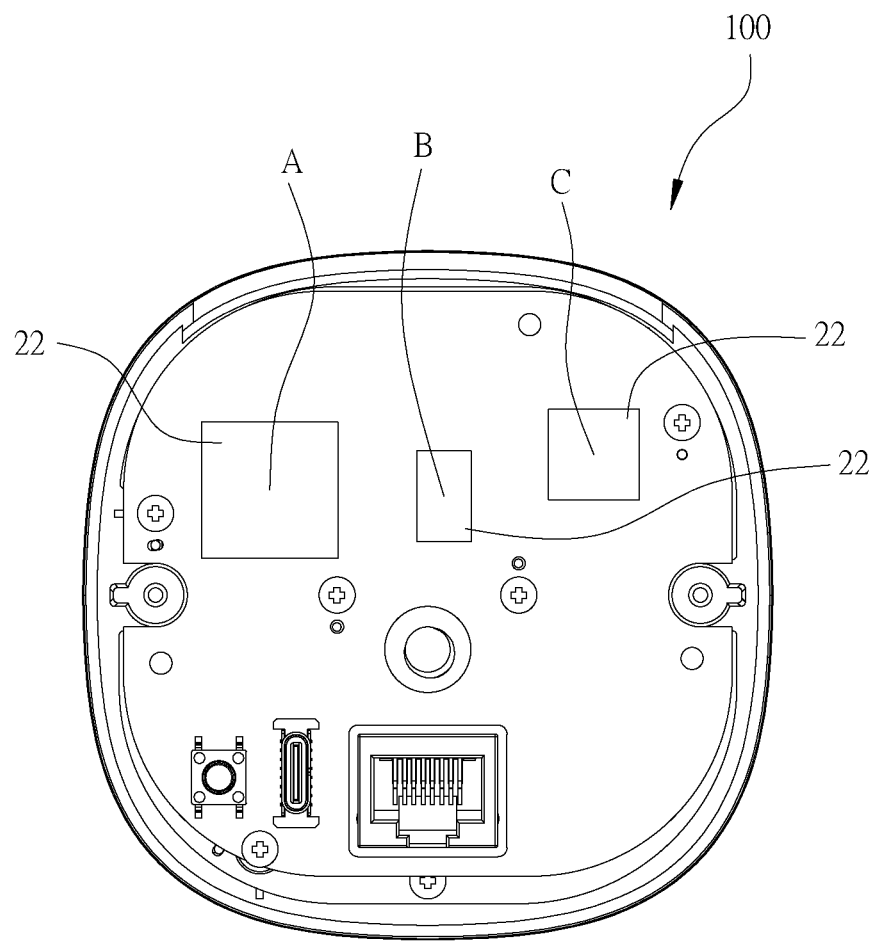
FIG. 8 is a rear view of the electronic device according to the first embodiment of the present invention, showing the rear holder and the aluminum or copper foil heat dissipator are removed.
Figure 9:
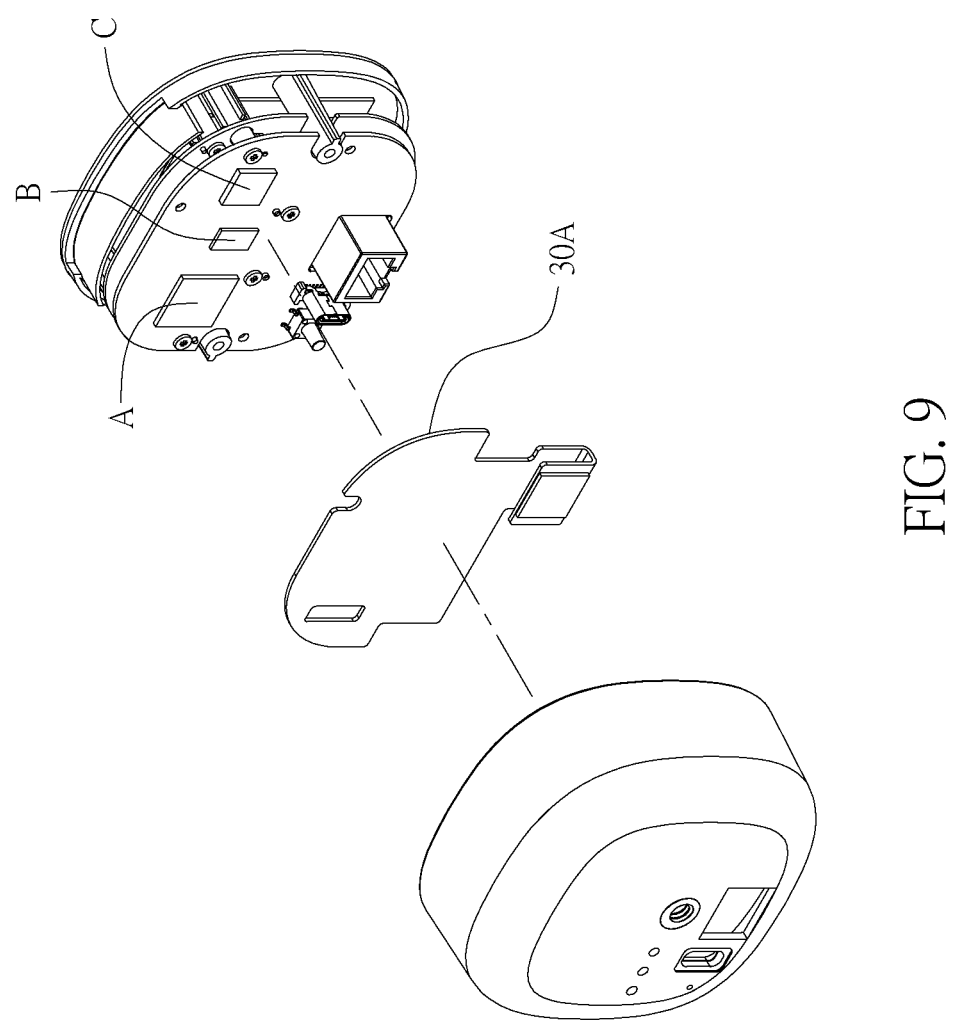
FIG. 9 is an exploded view, showing the aluminum or copper foil heat dissipator is replaced to the flat heat dissipator.

When the electronic device 100 having the aluminum or copper foil heat dissipator 30 operates, measure a temperature of a measurement point A, a measurement point B, and a measurement point C of the three heat source elements 22 shown in FIG. 8. After that, replace the aluminum or copper foil heat dissipator 30 with a normal flat heat dissipator 30A shown in FIG. 9, and then measure a temperature of the measurement point A, the measurement point B, and the measurement point C, wherein the three heat source elements 22 are respectively a central processing unit, a memory, and a signal processing unit and respectively have a limit temperature of 125° C., 110° C., and 110° C.

A specification margin between the limit temperatures and the temperatures measured from the measurement point A, the measurement point B, and the measurement point C and a determine result are list in the following Table 1.

TABLE 1

| Measurement point | Flat heat dissipator | | | Aluminum or copper foil heat dissipator | | |
|---|---|---|---|---|---|---|
| | Temperature | Specification margin | Determine result | Temperature | Specification margin | Determine result |
| A | 130° C. | −5° C. | Fail | 94.18° C. | 30.82° C. | Pass |
| B | 112° C. | −2° C. | Fial | 88.88° C. | 21.12° C. | Pass |
| C | 100° C. | 10° C. | Pass | 89.71° C. | 20.30° C. | Pass |

As can be seen from Table 1, when uses the aluminum or copper foil heat dissipator 30, the temperature of each of the heat source elements measured at the measurement point A, the measurement point B, and the measurement point C has a margin of more than 10 degrees Celsius, which has a better heat dissipation effect than when uses the flat radiator 30A to dissipate heat.

It must be pointed out that the embodiments described above are only some preferred embodiments of the present invention. All equivalent structures which employ the concepts disclosed in this specification and the appended claims should fall within the scope of the present invention.

What is claimed is:

1. An electronic device, comprising:
   a casing;
   an electronic structure disposed in the casing, wherein a surface of the electronic structure has at least one heat source element; and
   an aluminum or copper foil heat dissipator that is a 3D aluminum or copper foil structure formed by stamping and comprises a bottom and a surrounding portion connected around a periphery of the bottom, wherein a 3D space is formed between the bottom and the surrounding portion; the bottom is thermal conductively coupled to the at least one heat source element; at least one part of a surface of the aluminum or copper foil heat dissipator is thermal conductively coupled to an inner surface of the casing;
   wherein the bottom has at least one protruding portion protruding toward the at least one heat source element and forming a contact surface at a front side of the at least one protruding portion facing the at least one heat source element; a thermal pad is disposed on the contact surface to be thermal conductively coupled to the at least one heat source element;
   wherein the inner surface of the casing has at least one support protrusion inserted into the at least one protruding portion to support the at least one protruding portion; a surface of the at least one protruding portion is coated with a heat conductive glue to be thermal conductively coupled to the at least one support protrusion.

2. The electronic device as claimed in claim 1, wherein the at least one part of the surface of the aluminum or copper foil heat dissipator adjacent to the casing is coated with a heat conductive glue to be thermal conductively coupled to the inner surface of the casing.

3. The electronic device as claimed in claim 1, wherein at least a part of the electronic structure is received in the 3D space.

4. The electronic device as claimed in claim 1, wherein the casing has a column hole; a peripheral edge of the column hole is connected to a column tube; a copper column is inserted and fixed in the column tube; the bottom has a copper column cover fitting around the column tube and forming a contact surface at a surface adjacent to the copper column; the contact surface of the copper column cover is coated with a heat conductive glue to be thermal conductively coupled to the copper column.

5. The electronic device as claimed in claim 4, the aluminum or copper foil heat dissipator has at least one through-hole adapted to be penetrated through by the casing or a part of the electronic structure.

6. An electronic device, comprising:
   a casing;
   an electronic structure disposed in the casing, wherein a surface of the electronic structure has at least one heat source element; and
   an aluminum or copper foil heat dissipator that is a 3D aluminum or copper foil structure formed by stamping and comprises a bottom and a surrounding portion connected around a periphery of the bottom, wherein a 3D space is formed between the bottom and the surrounding portion; the bottom is thermal conductively coupled to the at least one heat source element; at least one part of a surface of the aluminum or copper foil heat dissipator is thermal conductively coupled to an inner surface of the casing; wherein the casing has a column hole; a peripheral edge of the column hole is connected to a column tube; a copper column is inserted and fixed in the column tube; the bottom has a copper column cover fitting around the column tube and forming a contact surface at a surface adjacent to the copper column; the contact surface of the copper column cover is coated with a heat conductive glue to be thermal conductively coupled to the copper column.

7. An aluminum or copper foil heat dissipator for an electronic device, wherein the aluminum or copper foil heat dissipator is a 3D aluminum or copper foil structure formed by stamping and comprises a bottom and a surrounding portion connected around a periphery of the bottom; a 3D space is formed between the bottom and the surrounding portion; the bottom is thermal conductively coupled to a heat source element of the electronic device;
   wherein the aluminum or copper foil heat dissipator has at least one through-hole formed by stamping the aluminum or copper foil heat dissipator and then cutting with a tool.

8. The aluminum or copper foil heat dissipator as claimed in claim 7, wherein the bottom has at least one protruding portion forming a contact surface at a front side of the at least one protruding portion facing the heat source element; the contact surface is adapted to be thermal conductively coupled to the heat source element of the electronic device.

\* \* \* \* \*